United States Patent
Yang et al.

(10) Patent No.: US 10,790,798 B2
(45) Date of Patent: Sep. 29, 2020

(54) ACOUSTIC RESONATOR AND METHOD FOR MANUFACTURING THE SAME

(71) Applicant: SAMSUNG ELECTRO-MECHANICS CO., LTD., Suwon-si (KR)

(72) Inventors: Jeong Suong Yang, Suwon-si (KR); Sang Hyun Yi, Suwon-si (KR); Ho Joon Park, Suwon-si (KR); Yeong Gyu Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 873 days.

(21) Appl. No.: 15/277,186

(22) Filed: Sep. 27, 2016

(65) Prior Publication Data
US 2017/0244379 A1    Aug. 24, 2017

(30) Foreign Application Priority Data

Feb. 18, 2016    (KR) .................. 10-2016-0019011

(51) Int. Cl.
*H03H 9/17*    (2006.01)
*H03H 9/10*    (2006.01)
*H03H 9/54*    (2006.01)

(52) U.S. Cl.
CPC ............ *H03H 9/17* (2013.01); *H03H 9/1014* (2013.01); *H03H 9/173* (2013.01); *H03H 9/54* (2013.01)

(58) Field of Classification Search
CPC ................................ H03H 9/1014; H03H 9/17
See application file for complete search history.

(56) References Cited

U.S. PATENT DOCUMENTS

| 7,341,888 B2 | 3/2008 | Nam et al. | |
| 7,755,151 B2* | 7/2010 | Lim | H03H 9/1092 257/416 |
| 2006/0249824 A1* | 11/2006 | Lee | H01L 24/97 257/678 |

FOREIGN PATENT DOCUMENTS

| JP | 2000-312127 A | 11/2000 | |
| KR | 1020070016855 | * 8/2005 | ............... H03H 9/15 |
| KR | 10-2006-0115791 A | 11/2006 | |
| KR | 10-0653089 B1 | 11/2006 | |

OTHER PUBLICATIONS

KR1020070016855 translation; Gwamg-Jae Shin Shin FBar Package.*
Chinese Office Action dated Jan. 10, 2020 in counterpart Chinese Patent Application No. 201610913961.0 (12 pages in English and 8 pages in Chinese).

* cited by examiner

*Primary Examiner* — Thomas M Dougherty
*Assistant Examiner* — Karen B Addison
(74) *Attorney, Agent, or Firm* — NSIP Law

(57) ABSTRACT

An acoustic resonator includes a substrate having via holes provided therein and having a membrane structure formed on a first surface of the substrate, and a cap accommodating the membrane structure and bonded to the substrate. The cap includes a support block in contact with the membrane structure.

16 Claims, 4 Drawing Sheets

ACOUSTIC RESONATOR AND METHOD FOR MANUFACTURING THE SAME

CROSS-REFERENCE TO RELATED APPLICATIONS

This application claims benefit under 35 U.S.C § 119(a) of priority to Korean Patent Application No. 10-2016-0019011 filed on Feb. 18, 2016 in the Korean Intellectual Property Office, the entire disclosure of which is incorporated herein by reference for all purposes.

BACKGROUND

1. Field

The following description relates to an acoustic resonator and a method for manufacturing the same.

2. Description of Related Art

As communications technology has developed rapidly, corresponding development of signal processing and radio frequency (RF) component technologies has been required. In particular, in accordance with the trend for the miniaturization of wireless communications devices, miniaturization of the radio frequency component technology has been actively required. An example of the miniaturization of the radio frequency component technology includes a filter having a form of bulk acoustic wave (BAW) resonator using semiconductor manufacturing technology.

The bulk acoustic wave (BAW) resonator refers to a resonator in which a resonance-causing element includes a thin film of a piezoelectric dielectric material deposited on a semiconductor substrate like a silicon wafer, and using piezoelectric characteristics of the piezoelectric dielectric material is implemented as the filter. Applications of the bulk acoustic wave (BAW) resonator include, but are not limited to, small and lightweight filters, an oscillator, a resonance element, and an acoustic resonance mass sensor, of mobile communications devices, and chemical and bio devices.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator includes a substrate having via holes provided therein and having a membrane structure formed on a first surface of the substrate, and a cap accommodating the membrane structure and bonded to the substrate. The cap includes a support block in contact with the membrane structure.

The membrane structure may cover at least a portion of the via holes.

The support block may support the membrane structure covering the via holes of the substrate. An insulating film may be disposed on a surface of the support block in contact with the membrane structure. The insulating film may be include an oxide film.

A surface of the support block adjacent the membrane may include protrusions configured to contact the membrane structure. The protrusions may have a gradually decreased cross-sectional area. The support block may make line contact with the membrane structure.

The membrane structure may include a connection electrode electrically connected to a connection conductor disposed in the via holes, and the support block may contact the connection electrode. The connection electrode may be disposed over the via holes.

The membrane structure may include multiple layers, at least one of the multiple layers being a piezoelectric layer.

In another general aspect, a method of manufacturing an acoustic resonator includes forming a membrane structure on a first surface of a substrate, and bonding a cap to the substrate such that a support block disposed in the cap contacts the membrane structure.

The method may further include, after the bonding of the cap to the substrate, forming a via hole in the substrate, and forming a connection conductor on an inner wall of the via hole.

The forming of the via hole may include forming the via hole below a portion at which the support block and the membrane structure make contact with each other.

The bonding of the cap to the substrate may further include forming an insulating film on a surface of the support block in contact with the membrane structure.

In another general aspect, an acoustic resonator includes a substrate having a via hole provided across a thickness of the substrate, a membrane disposed on a first end of the via hole, and a cover disposed above the membrane. The cover includes a projection projecting from an inner surface of the cover and contacting the membrane to counteract pressure from a second end of the via hole.

The cover may be bonded to the substrate.

The projection may have a shape configured to minimize a contact area between the projection and the membrane.

A surface of the projection contacting the membrane may be an insulator.

The membrane may include an electrode connected to a conductor disposed in the via hole.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
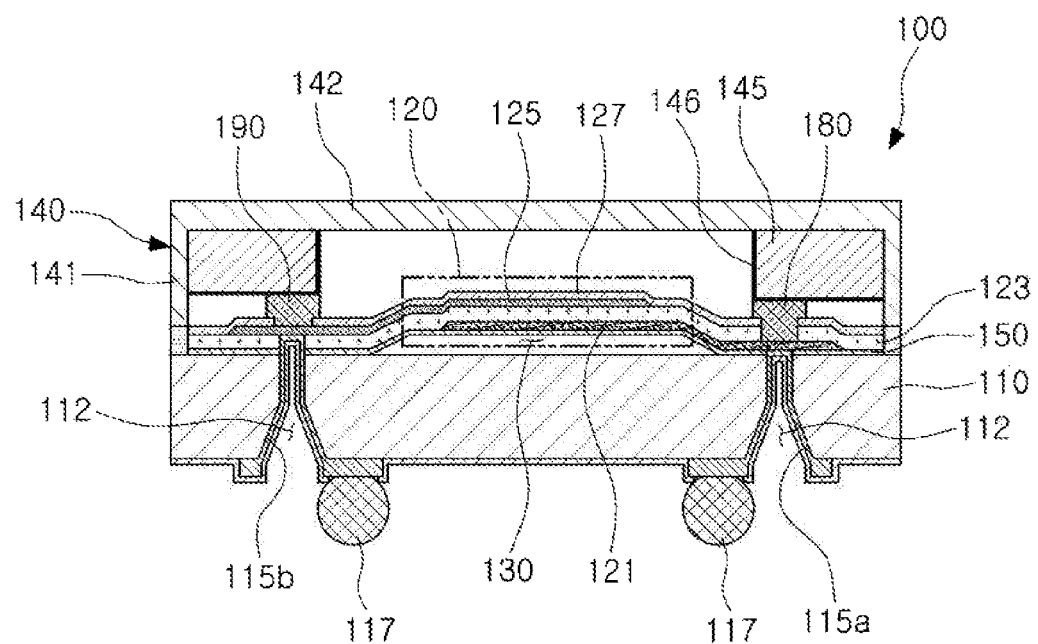
FIG. 1 is a cross-sectional view schematically illustrating an acoustic resonator according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The contents of the present disclosure described below may have a variety of configurations and propose only a required configuration herein, but are not limited thereto.

Figure 2:
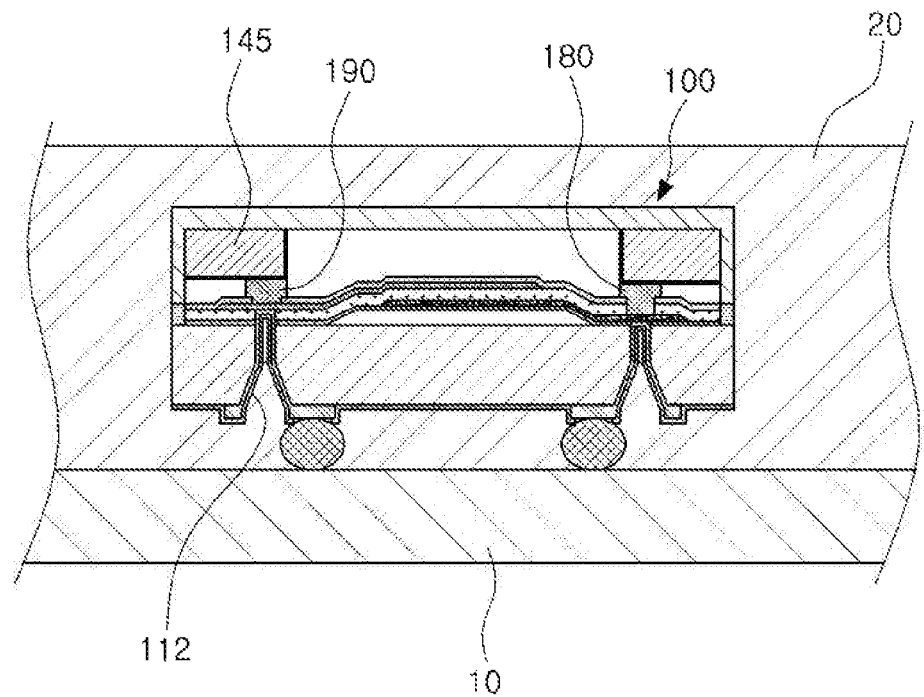
FIG. 2 is a cross-sectional view schematically illustrating a package having the acoustic resonator illustrated in FIG. 1.

FIG. 1 is a cross-sectional view schematically illustrating an acoustic resonator according to an embodiment in the present disclosure and FIG. 2 is a cross-sectional view schematically illustrating a package having the acoustic resonator illustrated in FIG. 1.

Referring to FIG. 1, an acoustic resonator 100 according to an embodiment in the present disclosure includes a substrate 110, a membrane structure, and a cap or a cover 140.

The membrane structure collectively refers to layers 121, 123, 125, 127, and 150 stacked on the substrate 110 to form a resonating part 120, and connection electrodes 180 and 190 formed in layers 121, 123, 125, 127, and 150.

An air gap 130 may be formed between the substrate 110 and the resonating part 120, and the resonating part 120 may be formed on a membrane layer 150 to be spaced apart from the substrate 110 by the air gap 130.

The substrate 110 may be a suitable semiconductor substrate such as, for example, a silicon substrate, a silicon on insulator (SOI) type substrate, or a substrate of any other material amenable to semiconductor manufacturing processes. However, the substrate 110 is not limited thereto.

As used herein, the term "suitable" material refers to a material having physical and chemical properties requisite for part or component for which the material is being used. In addition, the material is compatible to the manufacturing methods being used in making or fabricating the part, component, or the device as a whole. While examples are provided for suitable materials where applicable, the disclosure of this application is not limited to the example materials, and encompasses other suitable materials that will be apparent after an understanding of the disclosure of this application.

The resonating part 120 includes a first electrode 121, a piezoelectric layer 123, and a second electrode 125. The resonating part 120 may be formed by sequentially stacking the first electrode 121, the piezoelectric layer 123, and the second electrode 125 from below. Thus, the piezoelectric layer 123 may be disposed between the first electrode 121 and the second electrode 125.

Because the resonating part 120 is formed on the membrane layer 150, the membrane layer 150, the first electrode 121, the piezoelectric layer 123, and the second electrode 125 may be sequentially formed on the substrate 110, thereby forming a basic membrane structure.

The resonating part 120 may allow the piezoelectric layer 123 to resonate in response to signals applied to the first electrode 121 and the second electrode 125 to generate a resonance frequency and an anti-resonance frequency.

The first electrode 121 and the second electrode 125 may be formed of a suitable metal such as, for example, gold, molybdenum, ruthenium, aluminum, platinum, titanium, tungsten, palladium, chromium, nickel, or any combination thereof.

The resonating part 120 may use an acoustic wave of the piezoelectric layer 123. For example, when electrical signals are applied to the first electrode 121 and the second electrode 125, mechanical vibrations may occur in a thickness direction of the piezoelectric layer 123 to generate the acoustic wave.

The piezoelectric layer 123 may be formed of any suitable piezoelectric material including, but not limited to, zinc oxide (ZnO), aluminum nitride (AlN), quartz, lead zirconate titanate (PZT), barium titanate (BaTiO$_3$), or any combinations or variations thereof.

Resonance occurs when a wavelength of an electrical signal applied across the first electrode 121 and the second electrode 125 is twice the thickness of the piezoelectric layer 123. Because electrical impedance changes sharply when resonance occurs, the acoustic resonator may be used as a filter capable of selecting a particular frequency.

The resonance frequency is dependent on parameters including, but not limited to, the thickness of the piezoelectric layer 123, the thickness of the first electrode 121 and the second electrode 125 that surround the piezoelectric layer 123, and the inherent elastic wave velocity of the piezoelectric layer 123.

As an example, when the thickness of the piezoelectric layer 123 is reduced with all other parameters being constant, the resonance frequency is increased.

The resonating part 120 may further include a protection layer 127. The protection layer 127 may be formed on the second electrode 125 to prevent the second electrode 125 from being exposed to an external environment. The protection layer 127 may be formed of a suitable insulating material. The insulating material may include a silicon oxide based material, a silicon nitride based material, or an aluminum nitride based material, but is not limited thereto.

The first electrode 121 and the second electrode 125 may be connected to a first connection electrode 180 and a second connection electrode 190, respectively. The first connection electrode 180 and the second connection electrode 190 may be provided to confirm characteristics of the resonator and the filter and perform a required frequency trimming. However, the function of the first connection electrode 180 and the second connection electrode 190 is not limited thereto.

The resonating part 120 may be disposed to be spaced apart from the substrate 110 by the air gap 130 in order to improve a quality factor.

For example, by forming the air gap 130 between the resonating part 120 and the substrate 110, the acoustic wave generated from the piezoelectric layer 123 may not be influenced by the substrate 110.

Further, reflective characteristics of the acoustic wave generated from the resonating part 120 may be improved by the air gap 130. Because the air gap 130, an empty space, has impedance that approaches infinity, the acoustic wave may not be lost by the air gap 130 and may remain in the resonating part 120. Therefore, by reducing loss in the acoustic wave in a longitudinal direction by the air gap 130, a quality factor value of the resonating part 120 may be improved.

Via holes 112 penetrating through the substrate 110 are formed in a lower surface of the substrate 110. In addition, connection conductors 115a and 115b may be formed in each of the via holes 112.

The connection conductors 115a and 115b may be formed on inner surfaces of the via holes 112, that is, the entirety of inner walls 112a and 112b of the via holes 112, but are not limited thereto.

Further, a first end of the connection conductors 115a and 115b may be connected to an external electrode 117 formed on the lower surface of the substrate 110, and a second end of the connection conductors 115a and 115b may be connected to the first electrode 121 or the second electrode 125.

For example, a first connection conductor 115a may electrically connect the first electrode 121 with the external electrode 117, and a second connection conductor 115b may electrically connect the second electrode 125 with the external electrode 117. Therefore, the first connection conductor 115a may penetrate through the substrate 110 and the membrane layer 150 to be electrically connected to the first electrode 121, and the second connection conductor 115b may penetrate through the substrate 110, the membrane layer 150, and the piezoelectric layer 123 to be electrically connected to the second electrode 125.

It will be apparent after an understanding of the disclosure of this application that although only two via holes 112 and two connection conductors 115a and 115b are shown in the Figures, the number of via holes and connection conductors is not limited thereto. A greater number of via holes 112 and connection conductors 115a and 115b may be provided, as needed.

The cap 140 is provided to protect the resonating part 120 from an external environment. The cap 140 may be formed of a suitable material such as, for example, polyimide (PI), polybenzoxazole (PBO), benzocyclobuten (BCB), silicones, acrylates, epoxies, or any combinations thereof.

The cap 140 includes an internal space in which the resonating part 120 is accommodated, and may be formed in cover form. Thus, in an embodiment, the cap 140 may be bonded to the substrate 110 so that a side-wall 141 of the cap 140 surrounds the resonating part 120.

A lower surface of the side-wall 141, adjoining the upper surface of the substrate 110, may be used as a bonding surface with the substrate 110. The cap 140 may be bonded to the substrate 110 by a suitable process such as, for example, solid liquid inter-diffusion (SLID) bonding. As the SLID bonding, for example, a Cu—Sn bonding may be used. However, an Au—Sn bonding may also be used.

The cap 140 further includes a support block or a projection 145. The support block 145 may have dimensions configured such that the support block 145 pushes against the first connection electrode 180 and the second connection electrode 190 towards the substrate 110. Accordingly, the support block 145 may be formed in a block shape protruding from the inner surface of the cap 140, and may protrude a distance sufficient to have a lower surface of the support block 145 make contact with top surfaces of the connection electrodes 180 and 190, when the cap 140 is bonded to the substrate 110. The support block 145 may have any suitable shape such as, for example, a cube, or a cylinder. In some embodiments, the support block 145 may be in the form of a pillar with cross-sectional shape of a regular or an irregular convex polygon such as, for example, a quadrilateral, a pentagon, a hexagon, or an octagon. Other suitable cross-sectional shapes that serve to optimize the spatial efficiency as well as the material strength of the acoustic resonator module are also contemplated.

The support block 145 may be formed using any suitable material. For example, the support block 145 may be formed integrally during the manufacture of the cap 140, and may, thus, have the same material as the cap 140. In an embodiment, the support block 145 may be disposed on an inner surface of the cap. In such embodiments, the support block 145 may be formed of a same or different material as the cap 140. For example, the support block 145 may be formed of a polymer such as PDMS, a semiconductor, a metal, or a combination thereof. In embodiments with multiple support blocks, different support blocks may be formed of same or different materials.

The support block 145 may prevent the membrane structure formed over the via hole 112 from being damaged. A detailed description thereof will be provided below. In order to package the acoustic resonator 100, as illustrated in FIG. 2, the acoustic resonator 100 may be mounted on a package substrate 10, and an encapsulation part 20 such as, for example, an epoxy molding compound (EMC) may be formed to encapsulate the acoustic resonator 100. However, when a molding resin such as the EMC is injected into a mold to form the encapsulation part 20, pressure may be applied to the via hole 112. As a result, the membrane structure disposed over the via hole 112 may be exposed to stresses potentially damaging the membrane structure.

Therefore, in order to prevent damage to the membrane structure, the membrane structure may be supported over the via hole 112 from an upper portion of the membrane structure using a support structure such as, for example, the support block 145. The support block 145 is disposed over a portion of membrane structure covering the via hole 112 such as to prevent the portion of the membrane structure from distorting as a result of any pressure through the via hole 112.

The connection electrodes 180 and 190 may be disposed on the uppermost portion of the via hole 112. Therefore, the support block 145 may make contact with the connection electrodes 180 and 190, and thus, support the membrane structure. However, the support block 145 is not limited thereto. In a case in which the connection electrodes 180 and 190 are formed at different positions, the support block 145 may make direct contact with an uppermost layer (e.g., the protection layer) of the membrane structure to support the membrane structure.

Therefore, the cross-section of the support block 145 may extend wider than the cross-section of the via hole 112 formed in the top surface of the substrate 110 so as to support the entire area of the membrane structure that is suspended over the via hole 112.

Although the support block 145 is formed to protrude from an upper surface portion 142 and the side wall 141 of the cap 140, the configuration of the present disclosure is not limited thereto, and the support block 145 may be variously modified. For example, the support block 145 may be formed to protrude from the upper surface portion 142 of the cap 140 in the form of a pillar.

In embodiments where the support block 145 is formed of a conductive material, an insulating film 147 may be disposed on a surface of the support block 145. The insulating film 147 may be formed, for example, as an oxide film, but is not limited thereto.

The insulating film 147 may serve to prevent an eddy current from being generated in the support block 145. Therefore, the insulating film 147 may be formed on portions at which the support block 145 makes contact with the connection electrodes 180 and 190 to secure insulation between the connection electrodes and the support block 145.

In an embodiment, the support block 145 may be formed integrally with the cap 140. Therefore, the support block 145 may be manufactured together with the cap 140 in a process of manufacturing the cap 140. However, the support block 145 is not limited thereto, and may be variously modified. For example, the support block 145 may be bonded to the cap 140, after manufacturing the support block separately from the cap 140.

The acoustic resonator having the configuration as described herein may support a portion of the membrane structure suspended over the via hole 112, using the support block. As a result, damage of the membrane structure during packaging of the acoustic resonator may be prevented.

A method for manufacturing the acoustic resonator described herein is described in detail below.

Figure 3:
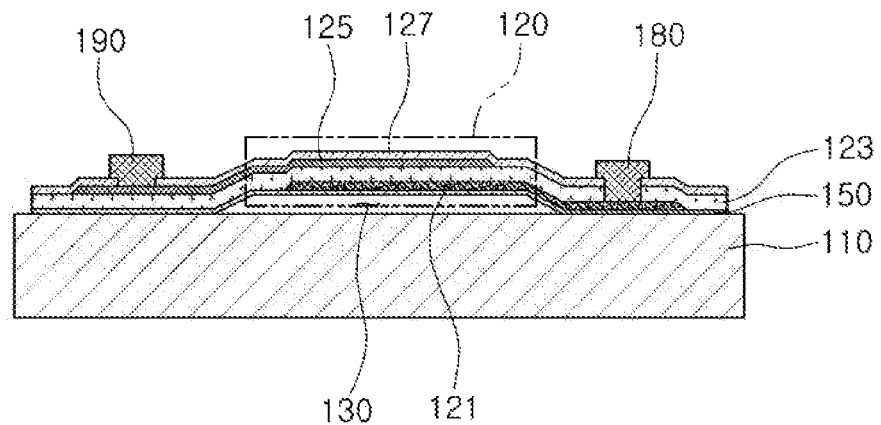
FIGS. 3 through 5 are views illustrating an acoustic resonator during the manufacturing using a method for manufacturing according to an embodiment.
Figure 4:
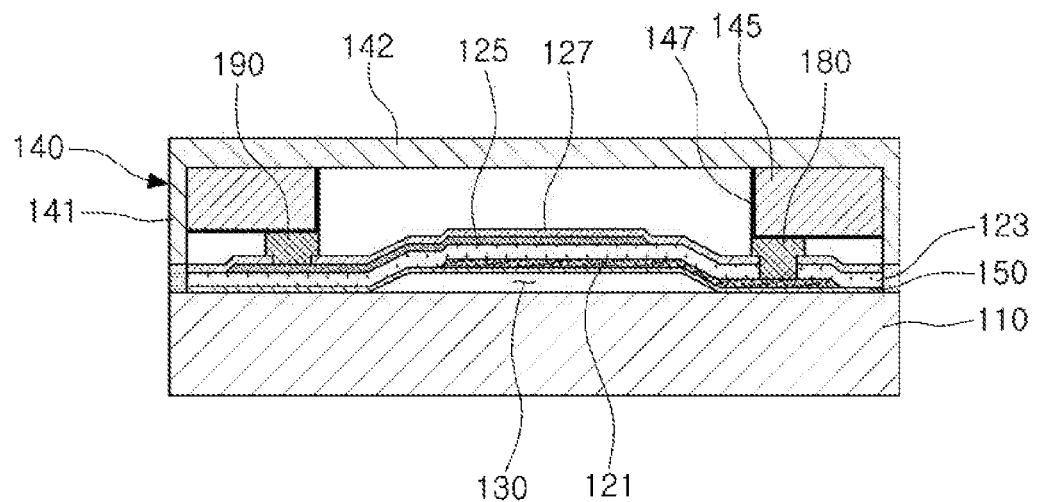
Figure 5:
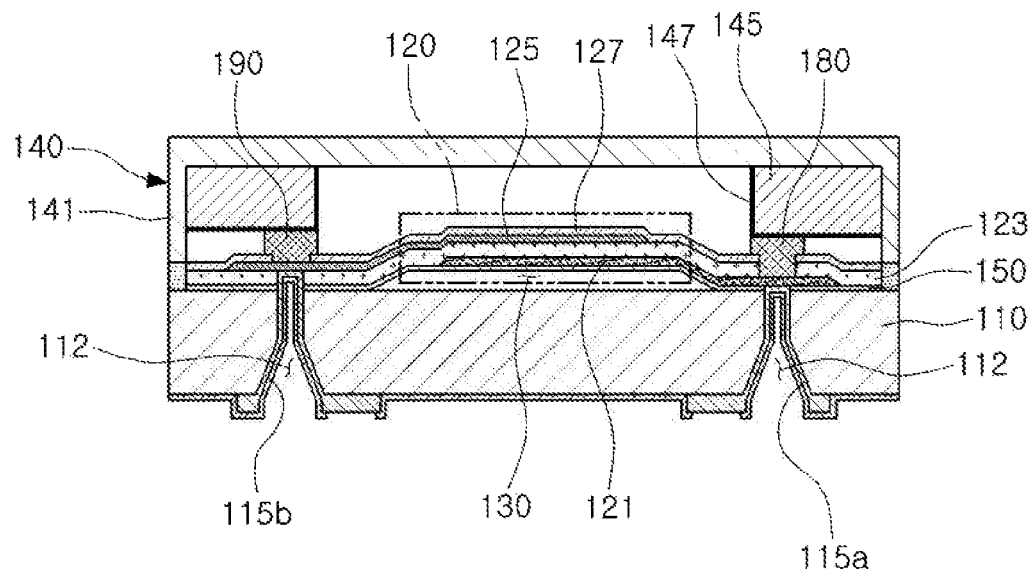

FIGS. 3 through 5 are views illustrating the acoustic resonator during the manufacturing using a method for manufacturing according to an embodiment.

Referring to FIG. 3, the membrane structure including the resonating part 120 is first formed on the substrate 110. The membrane structure may be formed by sequentially stacking the membrane layer 150, the first electrode 121, the piezoelectric layer 123, the second electrode 125, and the protection layer 127 on the substrate 110. In embodiments having the air gap 130, the air gap 130 may be formed by forming a sacrificial layer (not illustrated) before forming the membrane layer 150 and then removing the sacrificial layer. The sacrificial layer may be formed of a suitable material such as, for example, a polysilicon, silicon dioxide, silicon nitride, or a photoresist polymer. The sacrificial layer may be formed by any suitable process such as, for example, CVD, oxidation, spray pyrolysis, or spin coating. In some embodiments, the process for forming the sacrificial layer include more than one step. For example, in an embodiment, a cavity (not shown) is formed in the substrate by a suitable process such as, for example, etching or laser drilling. A negative photoresist may then be spin-coated on the substrate 110 so as to fill the cavity, the portion of the photoresist within the cavity hardened by exposure to UV light, and the portion of the outside of the cavity removed by dissolution in a suitable developer. In such embodiments, the sacrificial layer may be later removed in due course by a suitable process such as, for example, exposure to oxygen plasma. Other suitable processes for forming (as well as eventual removal) of the sacrificial layer are contemplated, and will be apparent after an understanding of the disclosure of this application.

The first electrode 121 and the second electrode 125 may be formed in a desired pattern by forming a conductive layer, depositing a photoresist on the conductive layer, performing a patterning process using, for example, a photolithography step, and then removing unnecessary portions of the conductive layer using the patterned photoresist as a mask. Removal of the conductive layer may be performed using any suitable step such as, for example, wet or dry etching, or ion milling.

According to the present embodiment, the first electrode 121 may be formed of molybdenum (Mo), and the second electrode 125 may be formed of ruthenium (Ru). However, the materials of the first and second electrodes 121 and 125 are not limited thereto, and the first electrode 121 and the second electrode 125 may be formed of various metals such as, for example, gold, ruthenium, aluminum, platinum, titanium, tungsten, palladium, chromium, or nickel. Any suitable method including, for example, thermal deposition, physical vapor deposition, pulsed laser deposition, or RF sputtering, may be used for forming the first conductive layer. The choice of the process will depend on the compatibility of the process with other materials and processes being used in forming the other components, parts or layers of the acoustic resonator module as will be apparent after an understanding of the disclosure of this application.

Further, the piezoelectric layer 123 may be formed of aluminum nitride (AlN). However, the material of the piezoelectric layer 123 is not limited thereto, and the piezoelectric layer 123 may be formed of various piezoelectric materials such as zinc oxide (ZnO), quartz, lead zirconate titanate (PZT), barium titanate (BaTiO$_3$), or any combinations or variations thereof. Any suitable process for depositing the piezoelectric material may be chosen depending on the material being used. For example, a zinc oxide piezoelectric layer may be deposited using any one of the processes including, but not limited to, spray pyrolysis, thermal deposition, sol-gel deposition, spin coating, or RF sputtering.

The protection layer 127 may be formed of an insulating material. Here, the insulating material may include a silicon oxide based material, a silicon nitride based material, and an aluminum nitride based material. Any suitable process for forming the protection layer 127 may be used. Examples of suitable processes include, but are not limited to, oxidation, or chemical vapor deposition.

Next, the first and second connection electrodes 180 and 190 respectively, for frequency trimming may be formed on the first electrode 121 and the second electrode 125. The connection electrodes 180 and 190 may be formed on the first and second electrodes 121 and 125, and may penetrate through the protection layer 127 or the piezoelectric layer 123 to be bonded to the first and second electrodes 121 and 125.

The first connection electrode 180 may be formed by partially removing the protection layer 127 and the piezoelectric layer 123 by a suitable etching process to expose the first electrode 121, and then depositing a suitable metal such as, for example, gold (Au), copper (Cu), aluminum (Al) or silver (Ag) on the first electrode 121.

Similarly, the second connection electrode 190 may be formed by partially removing the protection layer 127 by the etching to expose the second electrode 125, and then depositing a suitable metal such as, for example, gold (Au), copper (Cu), aluminum (Al) or silver (Ag) on the second electrode 125. The first and the second connection electrodes 180 and 190 may be formed using any suitable process compatible with manufacturing of other parts and components of the acoustic resonator 100.

Thereafter, after confirming characteristics of the resonating part 120 and the filter and performing a necessary frequency trimming using the connection electrodes 180 and 190, the air gap 130 may be formed.

The air gap 130 may be formed by removing the sacrificial layer (not shown) using a suitable process that is compatible with the materials of the other components and layers of the acoustic resonator. Examples of the process for removal of the sacrificial layer include, for example, dissolution in a suitable solvent, wet or dry etching, or exposure to oxygen plasma. As a result, the membrane structure and the resonating part 120 (FIG. 3) may be completed.

As illustrated in FIG. 4, the cap 140 may then be bonded onto the substrate 100 using a suitable process such as, for example, direct bonding, surface activated bonding, solid-liquid interdiffusion bonding, plasma activated bonding, thermocompression bonding, transient liquid phase diffusion bonding, adhesive bonding, or any combinations thereof.

The cap 140 may be formed by a wafer bonding at a wafer level. That is, a substrate wafer on which a plurality of unit substrates 110 are disposed, and a cap wafer on which a plurality of caps 140 are disposed may be bonded to each other to be formed integrally with each other.

In this case, the substrate wafer and the cap wafer which are bonded to each other may be diced by a dicing process later to be divided into individual acoustic resonators 100.

The cap 140 may be disposed on the substrate 110 so that the lower surface of the support block 145 makes contact with the connection electrodes 180 and 190. Therefore, the support block 145 may prevent the membrane structure from being delaminated or modified in a direction in which the cap 140 is disposed.

In an embodiment where a protruded distance of the support block is equal to a distance between the upper surface part 142 of the cap 140 and the connection electrodes 180 and 190, it is possible that the support block 145 may not make contact with the connection electrodes by a manufacturing tolerance. Therefore, the support block 145 does not simply make contact with the membrane structure, but may protrude from the upper surface portion 142 of the cap 140 by the distance at which the membrane structure may be supported at constant pressure.

In an embodiment, the protruded distance (or the thickness) of the support block 145 may be extended to be longer than the distance between the upper surface 142 of the cap 140 and the connection electrodes 180 and 190. In such an embodiment, when the extended distance of the support block 145 is too long, the membrane structure may be damaged by the support block 145. Therefore, the extended distance of the support block 145 may be determined as a distance at which the support block 145 supports the membrane structure while not damaging the membrane structure. For example, the extended distance may be determined to be 1 μm or less.

Accordingly, when the cap 140 is bonded to the substrate 110, the lower surface of the support block 145 may make contact with the connection electrodes 180 and 190, and then push against the membrane structure by as much as the extended distance, thereby firmly supporting the membrane structure.

Referring to FIG. 5, after the via holes 112 are formed in the substrate 110, the connection conductors 115a and 115b may then be formed in the via holes 112. The via holes 112 may be formed by a suitable method such as, for example, laser drilling, or a combination of photolithography and etching.

The via holes 112 may be formed below portions at which the support block 145 and the membrane structure make contact with each other. Because the support block 145 makes contact with the connection electrodes 180 and 190, the via holes 112 may be formed below the connection electrodes 180 and 190. However, in embodiments where the support block 145 makes contact with the membrane structure at different positions, instead of the connection electrodes 180 and 190, the via holes 112 may be formed below the corresponding positions where the support block 145 makes contact with the membrane structure.

The connection conductors 115a and 115b may be provided by forming a conductive layer on the inner surfaces of the via holes 112. For example, the connection conductors 115a and 115b may be formed by depositing or coating a conductive metal (e.g., gold, copper, or the like) along the inner walls of the via holes 112.

The acoustic resonator 100 illustrated in FIG. 1 may then be completed by forming an external electrode 117 on the lower surface of the substrate 110.

The external electrode 117 may be formed on the connection conductors 115a and 115b extended to the lower surface of the substrate 110. As the external electrode 117, a solder ball formed of a Sn material may be used, but a material of the external electrode 117 is not limited thereto.

In the method for manufacturing an acoustic resonator according to an embodiment having the configuration as described above, because the supporting block may be formed together with the cap in the operation of manufacturing the cap, a separate process of forming the supporting block may not be required.

Further, damage of the membrane structure in a process of packaging the acoustic resonator may be prevented by the support block.

Meanwhile, the acoustic resonator and the method for manufacturing the same according to the present disclosure are not limited to the above-mentioned embodiments, but may be variously modified.

Figure 6:
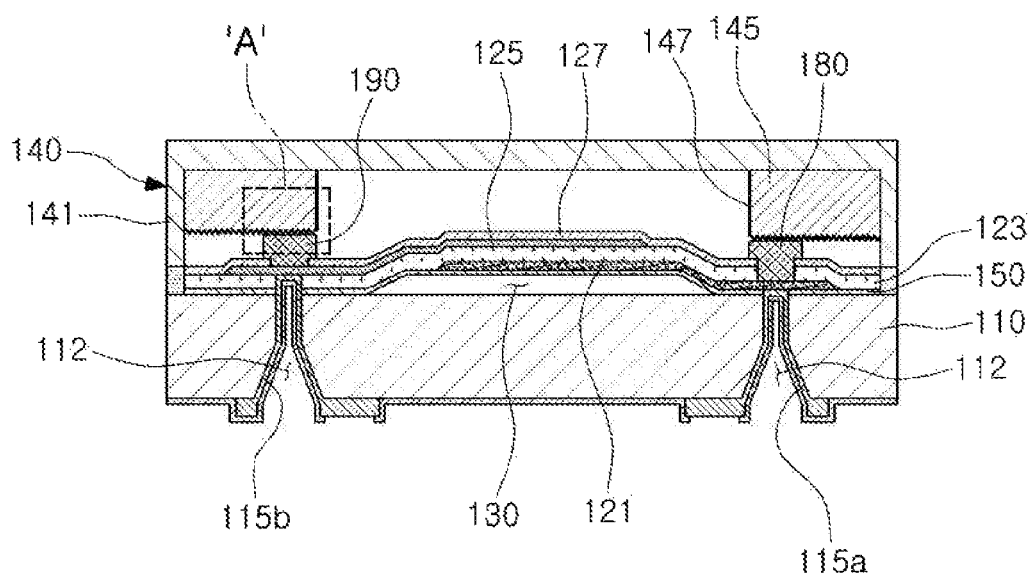
FIG. 6 is a cross-sectional view schematically illustrating an acoustic resonator according to another embodiment.
Figure 7:
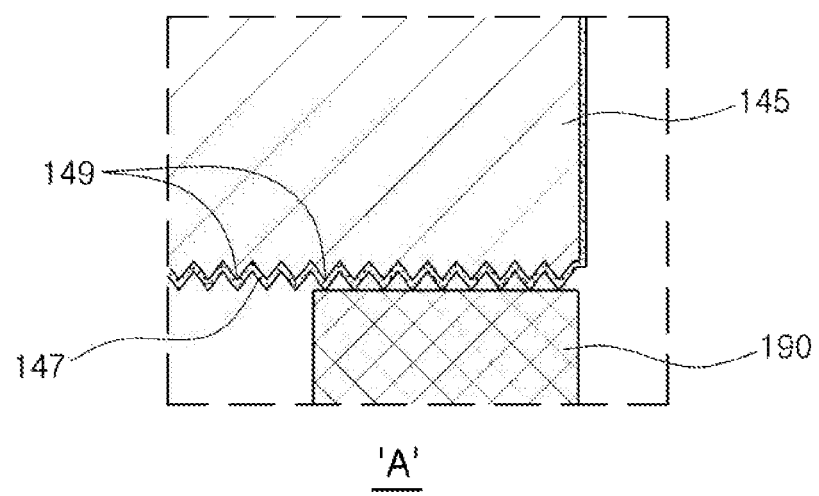
FIG. 7 illustrates an enlarged cross-sectional view of part A of FIG. 6.

FIG. 6 is a cross-sectional view schematically illustrating an acoustic resonator according to another embodiment and FIG. 7 is an enlarged cross-sectional view of part A of FIG. 6.

Referring to FIGS. 6 and 7, an acoustic resonator 100 according to an embodiment have protrusions 149 disposed on the lower surface of the support block 145.

The protrusion 149 may have a tapered end, and may be disposed in parallel to each other. The protrusions 149 may have a shape in which a cross-sectional area of the end thereof is gradually decreased and the end thereof is tapered. Further, the protrusions 149 may be formed to linearly protrude.

Accordingly, in an embodiment where the cap 140 is bonded to the substrate 110, the end of the protrusions 149 of the support block 145 may make contact with the connection electrodes 180 and 190.

The protrusion shape according to the present disclosure is not limited to the above-mentioned configuration, but may be variously modified. For example, a plurality of circular protrusions having concentricity and having different radii may be disposed to be used, and the like.

In the acoustic resonator having a configuration as described above, because the support block 145 and the connection electrodes 180 and 190 make line contact with each other, a contact area between the support block 145 and the connection electrodes 180 and 190 may be significantly reduced. Further, insulating film 147 may be formed on surfaces of the protrusions to prevent formation or induction of eddy currents into the supporting block 145 or the protrusions 149.

As set forth above, according to the embodiments in the present disclosure, the acoustic resonator may support the upper portion of the via hole, the vulnerable portion in the membrane structure, using the support block. As a result, damage of the membrane structure in the process of packaging the acoustic resonator may be prevented.

Although specific terminology has been used in this disclosure, for example, resonating part, it will be apparent after an understanding of the disclosure of this application that different terminology may be used to describe the same features, and such different terminology may appear in other applications.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator comprising:
a substrate having via holes provided therein and having a membrane structure disposed on a first surface of the substrate;
a cap bonded to the substrate, and accommodating the membrane structure, and
a support block in contact with the membrane structure and the cap,
wherein a surface of the support block includes protrusions.

2. The acoustic resonator of claim 1, wherein the membrane structure covers at least a portion of the via holes.

3. The acoustic resonator of claim 2, wherein the support block supports the membrane structure covering the via holes of the substrate.

4. The acoustic resonator of claim 3, wherein an insulating film is disposed on a surface of the support block in contact with the membrane structure.

5. The acoustic resonator of claim 4, wherein the insulating film comprises an oxide film.

6. The acoustic resonator of claim 1, wherein the protrusions contact the membrane structure.

7. The acoustic resonator of claim 6, wherein the protrusions have a gradually decreasing cross-sectional area.

8. The acoustic resonator of claim 7, wherein the support block makes line contact with the membrane structure.

9. The acoustic resonator of claim 1, wherein the membrane structure comprises a connection electrode electrically connected to a connection conductor disposed in the via holes, and
the support block contacts the connection electrode.

10. The acoustic resonator of claim 9, wherein the connection electrode is disposed over the via holes.

11. The acoustic resonator of claim 1, wherein the membrane structure comprises multiple layers, at least one of the multiple layers being a piezoelectric layer.

12. An acoustic resonator comprising:
a substrate comprising a via hole provided across a thickness of the substrate;
a membrane disposed on a first end of the via hole; and
a cover disposed above the membrane,
wherein the cover comprises a projection projecting from an inner surface of the cover and contacting the membrane to counteract pressure from a second end of the via hole.

13. The acoustic resonator of claim 12, wherein the cover is bonded to the substrate.

14. The acoustic resonator of claim 12, wherein the projection has a shape configured to minimize an area of contact between the projection and the membrane.

15. The acoustic resonator of claim 12, wherein a surface of the projection contacting the membrane comprises an insulator.

16. The acoustic resonator of claim 12, wherein the membrane comprises an electrode connected to a conductor disposed on an inner wall of the via hole.

* * * * *